United States Patent [19]

Yamada et al.

[11] 4,330,841
[45] May 18, 1982

[54] LOGIC CIRCUIT WITH ASYMMETRICAL QUANTUM INTERFEROMETRIC CIRCUITS

[75] Inventors: Hazime Yamada, Hoya; Akira Ishida, Tokyo, both of Japan

[73] Assignee: Nippon Telegraph & Telephone Public Corp., Tokyo, Japan

[21] Appl. No.: 140,756

[22] Filed: Apr. 16, 1980

[30] Foreign Application Priority Data

Jul. 25, 1979 [JP] Japan .................. 54-94450
Jul. 25, 1979 [JP] Japan .................. 54-94451

[51] Int. Cl.$^3$ .............................................. G06F 7/50
[52] U.S. Cl. ................... 364/784; 364/786; 307/476
[58] Field of Search ............... 364/784, 785, 786, 775; 307/212, 211, 216

[56] References Cited

U.S. PATENT DOCUMENTS

| | | | |
|---|---|---|---|
| 3,784,854 | 1/1974 | Herrell | 364/786 X |
| 4,117,354 | 8/1978 | Geewala | 307/212 X |
| 4,117,503 | 8/1978 | Zappe | 307/212 X |

OTHER PUBLICATIONS

Beha, "Asymmetric 2-Josephson-Junction Interferometer as a Logic Gate", Electronics Letters, Mar. 31, 1977, vol. 13, No. 7, pp. 218–220.
Herrell et al., "Binary Adder Using Josephson Devices", *IBM Tech. Disclosure Bulletin*, vol. 17, No. 5, Oct. 1974, pp. 1532–1534.
Zappe, "Quantum Interference Josephson Logic Devices", *Applied Physics Letters*, vol. 27, No. 8, Oct. 15, 1975, pp. 432–434.
Anacker, "Exclusive OR Gate in Latching Josephson Tunneling Logic", *IBM Tech. Disclosure Bulletin*, vol. 18, No. 10, Mar. 1976, pp. 3497–3498.

*Primary Examiner*—David H. Malzahn
*Attorney, Agent, or Firm*—Thompson, Birch, Gauthier & Samuels

[57] ABSTRACT

A logic circuit having at least one asymmetrical quantum interferometric circuit, wherein the logic output states correspond to the voltage state of the asymmetrical quantum interferometric circuit, the asymmetrical quantum interferometric device comprises: a parallel circuit including a first Josephson junction having a threshold current $I_{j1}$, a first inductance element having an inductance $L_1$ and connected in series with the first Josephson junction, a second Josephson junction having a threshold current $I_{j2}$, and a second inductance element having an inductance $L_2$ and connected in series with the second Josephson junction, the series-connected first Josephson junction and first inductance element being connected in parallel with the series-connected second Josephson junction and second inductance element; a bias current feeder for supplying a bias current to the first and second Josephson junctions; a control current feeder having series-connected inductance elements electromagnetically coupled respectively with the first and second inductance elements for supplying a control current to same; and an output feeder connected to the bias current feeder and the parallel circuit, the arrangement being such that the following relations are satisfied: $I_{j2}/I_{j1} = L_1/L_2 = a$, and $L_1 I_{j1} = L_2 I_{j2} < \Phi_o$ where a is a real number greater than 1, and $\Phi_o$ is a flux quantum unit equal to $2 \times 10^{-15}$ Wb, whereby the control current of one polarity for switching the voltage state of the asymmetrical quantum interferometric circuit can be minimized.

6 Claims, 18 Drawing Figures

| $I_{C1}$ | $I_{C2}$ | $I_F$ |
|---|---|---|
| 0 | 0 | 0 |
| 0 | 1 | 1 |
| 1 | 0 | 0 |
| 1 | 1 | 0 |

| X | Y | Z |
|---|---|---|
| 0 | 0 | 0 |
| 0 | 1 | 1 |
| 1 | 0 | 1 |
| 1 | 1 | 0 |

| $I_{C1}$ | $I_{C2}$ | $I_{C3}$ | $I_{F1}$ |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

FIG.16

| Un | Vn | Cn-1 | Cn | Sn |
|----|----|------|----|----|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

FIG.18

| Un | Vn | Cn' | Sn' |
|----|----|-----|-----|
| 0 | 0 | 0 | 0 |
| 0 | 1 | 0 | 1 |
| 1 | 0 | 0 | 1 |
| 1 | 1 | 1 | 0 |

LOGIC CIRCUIT WITH ASYMMETRICAL QUANTUM INTERFEROMETRIC CIRCUITS

BACKGROUND OF THE INVENTION

The present invention relates to a logic circuit with Josephson junctions, and more particularly to a logic circuit with at least one asymmetrical quantum interferometric circuit having asymmetrical bias curent vs. control current characteristics.

Logic gates in high-impedance circuits have heretofore been comprised of a symmetrical quantum interferometric circuit such as shown in "Applied Physics Letters", 25, No. 7, pp. 426–428(1974) entitled "Experimental observation of the switching transients resulting from single flux quantum transitions in superconducting Josephson devices" by P. Gueret. In such a symmetrical quantum interferometric circuit, a Josephson junction $J_1$ having a threshold current $I_{j1}$ is connected in series with an inductance element having an inductance $L_1$, and a Josephson junction $J_2$ having a threshold current $I_{j2}$ is connected in series with an inductance element having an inductance $L_2$. Such two series-connected circuits are connected in parallel with each other and are supplied with a bias current $I_B$. A control current $I_C$ flows through two series-connected inductance elements which are electromagnetically coupled with the inductances $L_1$, $L_2$, respectively. At this time, the following relations are established:

$$I_{j1}=I_{j2}, L_1=L_2, \text{ and } L_1 I_{j1}=L_2 I_{j2}<\Phi_o.$$

where $\Phi_o$ is a flux quantum unit equal to $2\times 10^{-15}$ Wb.

The voltage state of such a symmetrical quantum interferometric circuit is dependent on the magnetic field generated by the control current $I_C$. More specifically, an $I_B-I_C$ characteristic has a threshold curve that is symmetrical with respect to the axis of the bias current $I_B$, and the zero voltage state takes place within an area that is determined by the threshold value of $I_B$ and the threshold curve while a finite voltage takes place outside such an area. However, such a threshold curve is spread in the direction of the horizontal axis which scales the control current $I_C$ and its slope is 1(one) at the most. A control current of a relatively large amplitude and hence a great amount of power consumption are required for causing the apparatus to switch between the zero and finite voltages.

One approach toward amplification of the slope of the threshold curve to more than 1 is to use an asymmetric quantum interferometric circuit as described in "Asymmetric 2-Josephson-junction Interferometer as a Logic Gate" by H. Beha, Electronics Letters, 31st Mar. 1977, vol. 13, No. 7. With such a device, the values of threshold currents and inductances are asymmetrical, that is, $I_{j1}\neq I_{j2}$, and $L_1\neq L_2$. This prior art device, however, has a small range of bias current available for the switching between zero and finite voltages, and thus covers only a limited range of operation. Furthermore, it is difficult to reduce the amplitude of the control current. Accordingly, such a device has practically been infeasible.

SUMMARY OF THE INVENTION

It is an object of the present invention to provide an improved logic circuit with an asymmetrical quantum interferometric circuit that can cover an increased range of operation and switch between zero and finite voltages with a control current of a small amplitude.

Another object of the present invention is to provide a logic circuit utilizing an improved asymmetrical quantum interferometric circuit which is capable of wide range operation and high-sensitivity operation with a small-amplitude control current.

Still another object of the present invention is to provide a binary adder circuit utilizing a combination of improved asymmetrical quantum interferometric circuits.

According to the present invention, there is provided a logic circuit having at least one asymmetrical quantum interferometric circuit with logic output states correspond to the voltage states of the asymmetrical quantum interferometric circuit. The asymmetrical quantum interferometric circuit comprises a parallel circuit which includes a first Josephson junction having a threshold current $I_{j1}$ and connected in series with a first inductance element having an inductance $L_1$, and a second Josephson junction having a threshold current $I_{j2}$ and connected in series with a second inductance element having an inductance $L_2$, the series-connected first Josephson junction and first inductance element being connected in parallel with the series-connected second Josephson junction and second inductance element; a feeder for supplying a bias current to the first and second Josephson junctions; a feeder for supplying a control current to the inductance elements that are series-connected with each other for electromagnetic coupling respectively with the first and second inductance elements; and an output line extending from one end of the parallel circuit, the arrangement being such that the following relations are satisfied:

$$I_{j2}/I_{j1}=L_1/L_2=a$$

$$L_1 I_{j1}=L_2 I_{j2}<\Phi_o$$

where a is a real number greater than 1, and $\Phi_o$ is a flux quantum unit equal to $2\times 10^{-15}$ Wb, whereby the control current of one polarity for switching the voltage state of the asymmetrical quantum interferometric circuit can be minimized.

In one specific aspect of the invention, a plurality of asymmetrical quantum interferometric circuits are advantageously combined to provide a binary adder circuit.

BRIEF DESCRIPTION OF THE DRAWINGS

FIG. 16 is a truth table for the circuit of FIG. 14;

FIG. 18 is a truth table for the circuit of FIG. 17.

DESCRIPTION OF THE PREFERRED EMBODIMENTS

Figure 1:
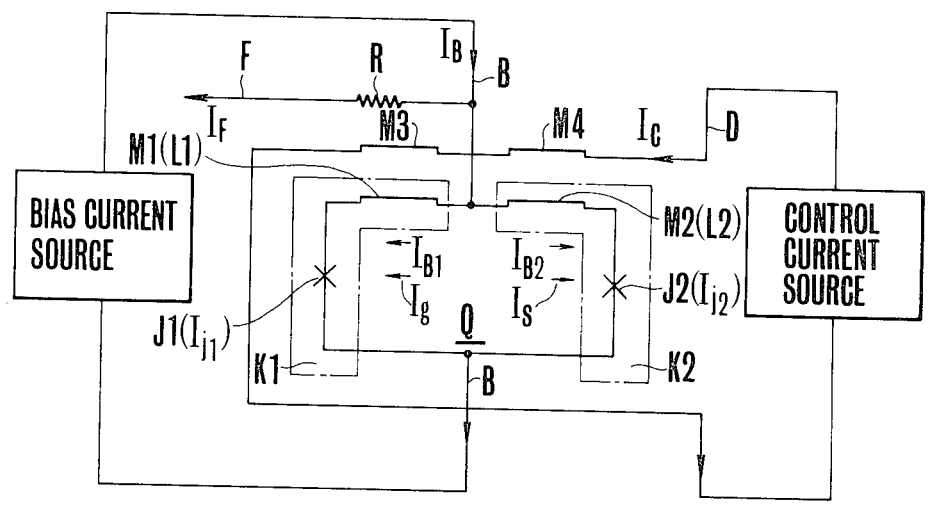
FIG. 1 is a circuit diagram of an asymmetrical quantum interferometric circuit constructed in accordance with the present invention.

As shown in FIG. 1, an asymmetrical quantum interferometric circuit in accordance with the present invention comprises a circuit $K_1$ including a Josephson junction $J_1$ having a threshold current $I_{j1}$ and connected in series with an inductance element $M_1$ having an inductance $L_1$, and a circuit $K_2$ including a Josephson junction $J_2$ having a threshold current $I_{j2}$ greater than the threshold current $I_{j1}$ and connected in series with an inductance element $M_2$ having an inductance $L_2$, the circuits $K_1$, $K_2$ being connected in parallel with each other to form a circuit Q. The arrangement is such that the following relations are established:

$$L_1 \cdot I_{j1} \approx L_2 \cdot I_{j2} < \Phi_o, \text{ and}$$

$$I_{j2}/I_{j1} \approx L_1/L_2 = a > 1$$

where $\Phi_o$ is a flux quantum unit equal to $2.07 \times 10^{-15}$ Wb, and a is a real number. The circuit Q is placed in a bias current feeder B, and an output line F is coupled via an impedance element R such as a resistor with the bias current feeder B leading to one terminal of the circuit Q. A control current feeder D is connected with a pair of series-connected inductance elements $M_3$, $M_4$ that are electromagnetically coupled respectively with the inductance elements $M_1$, $M_2$ in the circuit Q. Assuming that a bias current $I_B$ is supplied from a source of bias current to flow over the bias current feeder B, and is divided into currents $I_{B1}$ and $I_{B2}$ that flow respectively through the elements $M_1$, $M_2$ in the circuit Q, the following relation is established: $I_{B2} = a \cdot I_{B1}$. The inductance elements $M_1$ through $M_4$ are so connected that when a control current $I_C$ flows from a source of control current over the control current feeder D, current induced in the inductance element $M_1$ by the inductance element $M_3$ flows in the same direction as the current induced in the inductance element $M_2$ by the inductance element $M_4$.

With such an arrangement, a combination of the current $I_B$ flowing in the bias current feeder B and the current $I_C$ flowing in the control current feeder D enables the circuit Q to be in either a zero voltage state or a finite voltage state.

Figure 2:
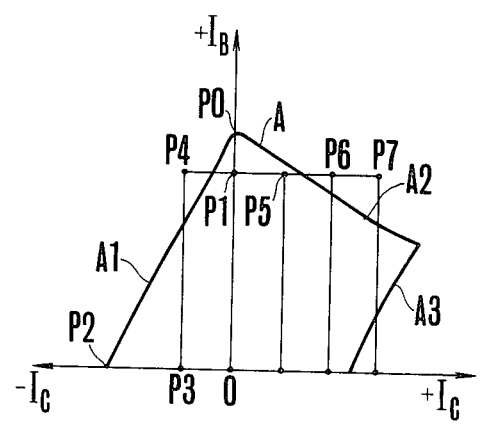
FIG. 2 is a graph showing a bias current vs. control current characteristic of the circuit shown in FIG. 1.

Specifically, the circuit Q has an $I_B - I_C$ characteristic having a threshold curve A as shown in FIG. 2, the curve being obtained by plotting the switching points at which the zero voltage state switches to the finite voltage state as a function of the magnitudes of current $I_B$ on the ordinate axis and current $I_C$ on the abscissa axis in Cartesian coordinates. When the values for the currents $I_B$, $I_C$ have a coordinate position within the area defined by the threshold curve A, the circuit Q is in the zero voltage state, and when their coordinate position is outside the area, the circuit Q is in the finite voltage state.

More specifically, under the condition that $L_1/L_2 = a > 1$, the bias current $I_B$ is divided into the current $I_{B1}$ that flows through the circuit $K_1$ and the current $I_{B2} = a\ I_{B1}$ that flows through the circuit $K_2$. The bias current that flows into the circuit $K_2$ is a times as large as the bias current that flows into the circuit $K_1$. When the current $I_{B2}$ and the current $I_{B1}$ are smaller than the threshold currents $I_{j2}$ and $I_{j1}$, respectively, the circuit Q is in the superconducting state. At this time, the control current $I_C$ is passed through the feeder D in the direction of arrow in FIG. 1 (the control current is assumed to be positive in this direction), generating a magnetic field directed from back to face at the sheet of the drawing. Then, a shield current $I_S$ flows through the circuit Q in the superconducting state in the direction of arrow in FIG. 1 so as to produce a magnetic field directed from face to back for cancelling the magnetic field generated by the control current $I_C$. The shield current $I_S$ is added to the current $I_{B2}$ and cancels the current $I_{B1}$. With the combined current $I_S + I_{B2}$ reaching the threshold current $I_{j2}$ of the Josephson junction $J_2$, the Josephson junction $J_2$ is switched into a normal conductive state, while the Josephson junction $J_1$ is not switched into a normal conductive state due to the combined current $I_S - I_{B1}$ even with the threshold current $I_{j1}$ being smaller than the threshold current $I_{j2}$. As the junction $J_2$ is in the normal conductive state, the shield current $I_S$ disappears, whereupon a current $I_g$ induced by the control current $+I_C$ through electromagnetic induction flows through the circuit Q in the direction of arrow in FIG. 1. Such an induced current $I_g$ is added to the current $I_{B1}$, and the resulting combined current $I_g + I_{B1}$ reaches the threshold current $I_{j1}$ of the Josephson junction $J_1$, with the result that the circuits $K_1$, $K_2$ are rendered normally conductive, and the circuit Q is in the finite voltage state, causing a current $I_F$ to flow through the output line F via the resistor R. Accordingly, by selecting a suitable value for a, a portion $A_2$ of the threshold curve A becomes available which has a slope smaller than 1 (one) with respect to the control current $+I_C$ and has one end at a turning point $P_o$ on the axis of $I_B$.

A portion $A_3$ of the threshold curve A will now be described. When the bias current is reduced to render the combined current $I_{B1} - I_S$ negative, the current $I_{B1} - I_S$ can reach the current $-I_{j1}$ before the combined current $I_{B2} + I_S$ reaches the current $I_{j2}$, with the result that the junction $J_1$ first gets into the finite voltage state. The smaller the bias current, the smaller the control current $I_C$ is required for this to take place. Thus, the portion $A_3$ of the threshold curve A has a negative slope.

When the direction of flow of the control current $I_C$ is reversed so as to cause a current $-I_C$ to flow, there is obtained a portion $A_1$ of the threshold curve A which is steeper than the portion $A_2$ with respect to the axis of $I_C$. More specifically, at this time, the shield current $I_S$ is added to the current $I_{B1}$, and with the threshold current $I_{j1}$ being smaller than the threshold current $I_{j2}$, the circuit Q can enter into the finite voltage state with a smaller value for the control current $I_C$. Therefore, the portion $A_1$ of the curve is available which is steeper than the curve portion $A_2$.

Under the conduction of control current $-I_C$, for $I_B$ having a value at point P1 which is below the turning point Po and within the area defined by the threshold curve A and for $-I_C$ having a value at point P3 which is on the right of point P2 and hence within the area, a coordinate point P4 is determined at which the finite voltage state is realized.

When both the currents $I_B$ and $I_C$ are zero, the circuit Q is in the zero voltage state. When the current $I_B$ is zero and the current $I_C$ has a value at point P3 in FIG. 2, the circuit Q is also in the zero voltage state. When the current $I_B$ has a value at point $P_1$ and the current $I_C$ is zero, the circuit Q is also in the zero voltage state. Under the conduction of control current $+I_C$, the circuit Q is in the zero voltage state when the current $I_B$ has a value at point $P_1$ and the current $I_C$ has a positive value at point $P_5$. However, the circuit Q gets into the finite voltage state when the current $I_C$ is increased up to a value at point $P_6$ or $P_7$ with the current $I_B$ being still at the point $P_1$.

Figure 3:
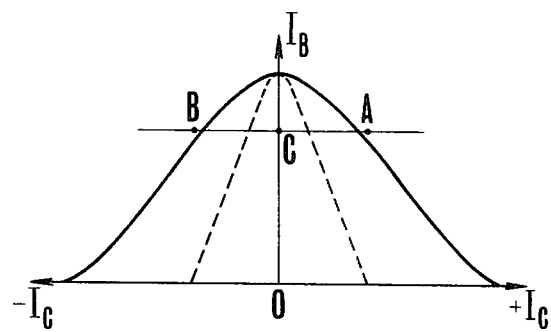
FIG. 3 is a graph showing a bias current vs. control current characteristic of a conventional symmetric quantum interferometric circuit.

A comparison will now be made between the characteristics of a conventional symmetrical quantum interferometric circuit and an asymmetrical quantum interferometric circuit according to the present invention. As shown in FIG. 3, the $I_B-I_C$ characteristic curve of the conventional circuit is illustrated by solid line. In order to switch between the voltage states at a constant bias current, the circuit has to be supplied with a positive control current $+I_C$ which corresponds to the interval between point C (zero voltage area) and point A (finite voltage area), or a negative control current $-I_C$ which corresponds to the interval between point C and point B (finite voltage area). To improve such a characteristic curve, it is necessary that the slope of the threshold curve be steeper and take a form shown by broken line in FIG. 3.

Figure 4:
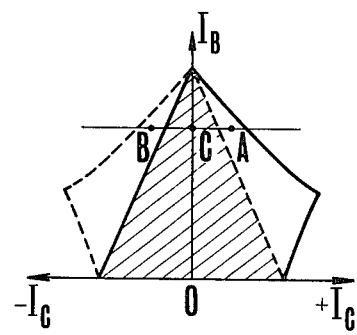
FIG. 4 is a graph explanatory of the characteristic of FIG. 2.

According to the asymmetrical quantum interferometric circuit of the present invention, the characteristic curve is shown by solid line in FIG. 4. If a characteristic curve shown by the broken line which is available by reversing the direction of the control current were superposed on the solid line curve, a combined characteristic curve represented by the hatched portion in FIG. 4 would be obtained, it being substantially the same as the broken-line curve shown in FIG. 3.

Figure 5:
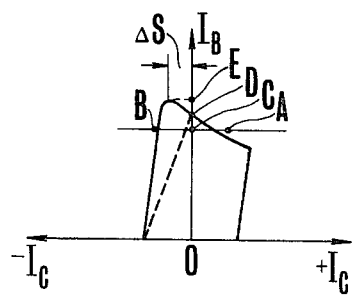
FIG. 5 is a graph showing a bias current vs. control current characteristic of a conventional asymmetrical quantum interferometric circuit.

The asymmetrical quantum interferometric circuit by Beha has a characteristic curve as represented by solid line in FIG. 5. Since the highest point of the curve is shifted $\Delta S$ from the $I_B$ axis, a relatively large negative control current is required to reach the point B (finite voltage area). Furthermore, when a bias current greater than point D is supplied, the finite voltage state results. Therefore, a bias current having a magnitude between points D and E is practically difficult to use. Such a bias current cannot be used when two circuits are superimposed in their characteristics having control currents of opposite polarities. This type of circuit has therefore a narrow range of operations. In contrast, with the circuit according to the present invention, a characterisitc having a threshold curve shown partly by broken line in FIG. 5 allows the voltage switching to be effected by a small control current, giving the circuit a wide range of operation.

An experiment has indicated that when a ranging from 1 to 20, preferably from 1 to 10, there is obtained an $I_B-I_C$ characteristic in which $\Delta S=O$ and the portion $A_1$ of the threshold curve A in FIG. 2 has a slope greater than 1.

Figure 6:
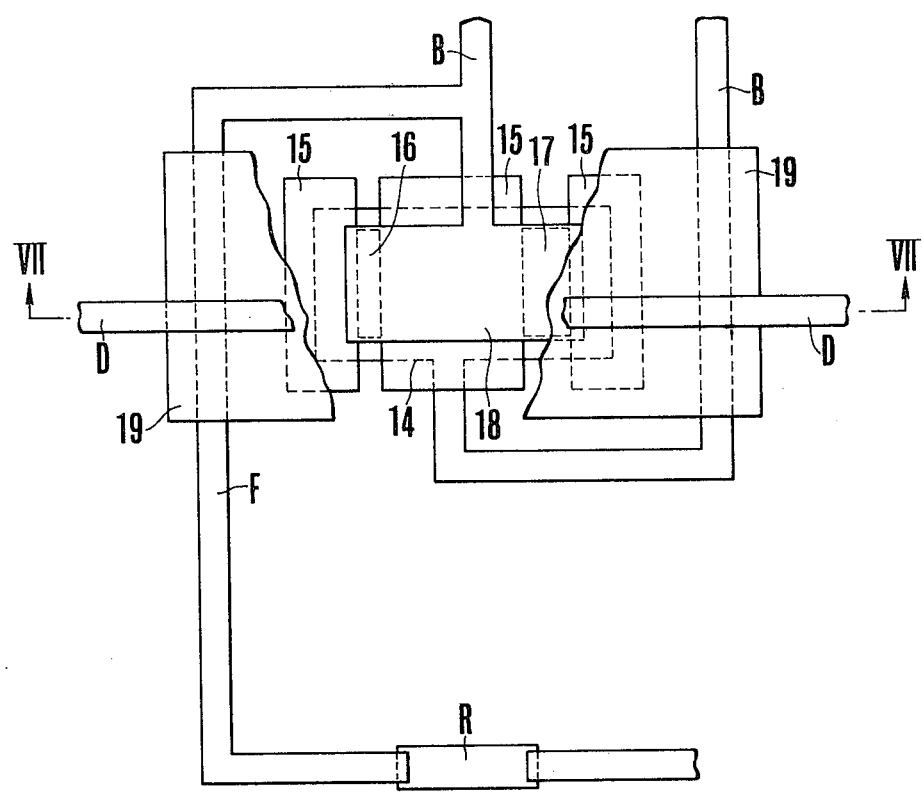
FIG. 6 is a plan view with parts broken away of a structure of the circuit of FIG. 1.
Figure 7:
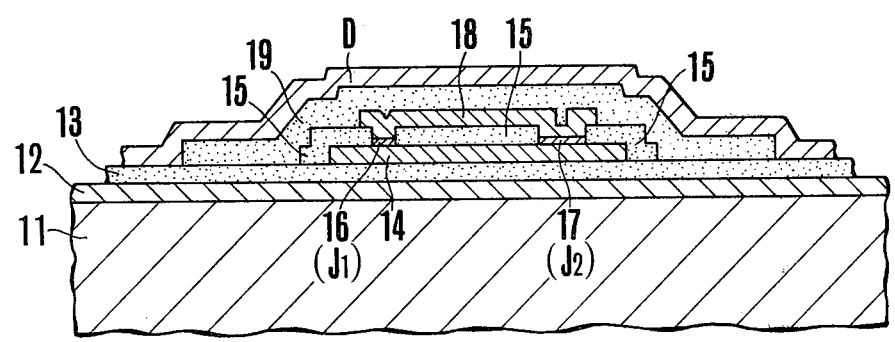
FIG. 7 is a sectional view taken along line VII—VII in FIG. 6.

A structural detail of the asymmetrical quantum interferometric circuit illustrated in FIG. 1 is shown in FIGS. 6 and 7 in which like or corresponding parts are denoted by like or corresponding reference numerals. An insulating substrate 11 supports theron a superconductor grounding layer 12 on which there is disposed an insulating layer 13. An electrode 14 is mounted on the insulating layer 13 and covered with an insulating layer 15 except two regions in which there are disposed tunneling barriers 16, 17 to form Josephson junctions $J_1$, $J_2$, respectively. An electrode 18 is mounted on the insulating layer 15 and interconnects the barriers 16, 17. An insulating layer 19 covers the electrode 18 and the insulating layer 15, and is attached to the insulting layer 13. The control current feeder D extends over the insulating layer 19. The bias current feeder B is connected at one end to the electrode 18, to which a logic output line F is connected, the logic output line F being connected at the other end to a resistor R. The other end of the bias current feeder B is connected to the electrode 14. With this arrangement, the electrode 18 constitutes an inductance such that the control current feeder D and the electrode 18 are electromagnetically coupled with each other.

Figures 8, 9:
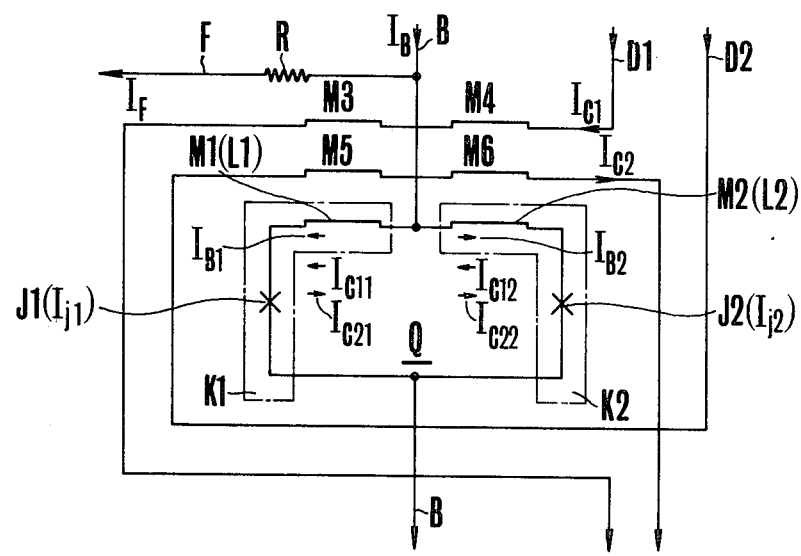
FIG. 8 is a circuit diagram of a logic circuit having the asymmetrical quantum interferometric circuit according to the present invention.
FIG. 9 is a truth table for the logic circuit of FIG. 8.

FIG. 8 shows a logic circuit utilizing the asymmetrical quantum interferometric circuit described with reference to FIGS. 1 through 7, there being no current sources shown in FIG. 8 for clarity. Like or corresponding reference numerals denote like or corresponding parts in FIGS. 1 and 8. The structure of the logic circuit shown in FIG. 8 is substantially the same as that of the device of FIG. 1 except that the control current feeder D is replaced with a pair of control current feeders $D_1$ and $D_2$ including inductance elements $M_3$, $M_4$ and $M_5$, $M_6$, respectively, the elements $M_3$, $M_5$ and $M_4$, $M_6$ being electromagnetically coupled respectively with the inductance elements $M_1$ and $M_2$ in the circuit Q. The bias current $I_B$ is divided into currents $I_{B1}$ and $I_{B2}$ flowing respectively through the elements $M_1$, $M_2$. The elements $M_3$, $M_4$ are electromagnetically coupled with the elements $M_1$, $M_2$, respectively, such that when a control current $I_{C1}$ flows through the feeder $D_1$, a current $I_{C11}$ is electromagnetically induced in the element $M_1$ which flows in the same direction as the current $I_{B1}$, and a current $I_{C12}$ is electromagnetically induced in the element $M_2$ which flows in the opposite direction to the current $I_{B2}$. The elements $M_5$, $M_6$ are electromagneticaly coupled with the elements $M_1$. $M_2$, respectively, such that when a control current $I_{C2}$ flows through the feeder $D_2$, a current $I_{C21}$ is electromagnetically induced in the element $M_1$ which flows in the opposite direction to the current $I_{B1}$, and a current $I_{C22}$ is electromagnetically induced in the element $M_2$ which flows in the same direction as the current $I_{B2}$.

With such an arrangement, it is assumed that the current $I_B$ has a value of the point $P_1$ in FIG. 2 and the absolute values of the currents $I_{C1}$ and $I_{C2}$ are equal to the point $P_3$ with the current $I_{C1}$ flowing in the forward direction and the current $I_{C2}$ in the reverse direction in terms of the current $I_C$ in FIG. 2. That is, the currents $I_B$, $I_{C1}$ and $I_{C2}$ are so selected that the coordinate position of the currents $I_B$, $I_{C1}$ is indicated by the point $P_5$ and the coordinate position of the currents $I_B$, $I_{C2}$ is indicated by the point $P_4$. Values of the currents $I_B$, $I_{C1}$ and $I_{C2}$ meeting such conditions that are represented herein by binary "1". It is also assumed that when the currents $I_B$, $I_{C1}$ and $I_{C2}$ are all zero, their values are binary "0" and that the presence of current $I_F$ branching from current $I_B$ into line F represents binary "1" and the absence thereof binary "0".

With the current $I_B$ being at "1", the current $I_F$ becomes "1"; when only the current $I_{C2}$ is at "1" and the current $I_F$ becomes "0" at other values of the currents $I_{C1}$, $I_{C2}$ as illustrated in the truth table of FIG. 9. When both of the currents $I_{C1}$, $I_{C2}$ are at "1", the positive current $+I_C$ and the negative current $-I_C$ of the same absolute value flow at the same time, resulting in no control current.

Figures 10, 11:
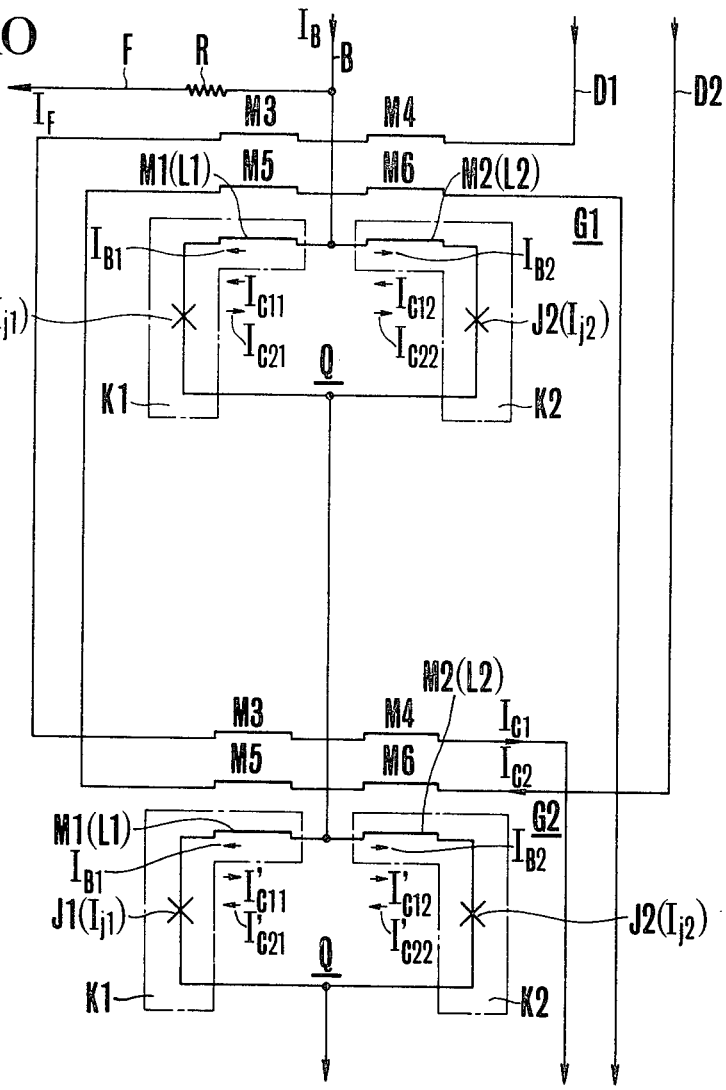
FIG. 10 is a circuit diagram of an exclusive -OR gate circuit having the asymmetrical quantum interferometric circuits of the present invention.
FIG. 11 is a truth table for the circuit of FIG. 10.

FIG. 10 shows an exclusive-OR logic circuit having a plurality of the asymmetrical quantum interferometric circuits according to the present invention. Corresponding parts are denoted by corresponding reference numerals in FIGS. 8 and 10. The logic circuit comprises a pair of circuits $G_1$ and $G_2$, each of the same structure as that of the circuit shown in FIG. 8, with the impedance element R associated with the circuit $G_2$ being omitted. The circuits Q in the logic circuits $G_1$, $G_2$ are connected in series with each other in the bias current feeder B, and the inductance elements $M_1$, $M_2$ of the circuit Q in the logic circuit $G_2$ are electromagnetically coupled with the control current feeders $D_1$, $D_2$. The other circuit arrangement is the same as that shown in FIG. 8. Assuming that the current $I_{C1}$ flowing through the feeder $D_1$ electromagnetically induces current $I'_{C11}$ and $I'_{C12}$ which flow through the elements $M_1$ and $M_2$, respectively, of the circuit $G_2$, the feeder $D_1$ is electromagnetically coupled with the elements $M_1$, $M_2$ of the circuit $G_2$ such that the currents $I'_{C11}$ and $I'_{C12}$ flow respectively in the opposite direction to and in the same direction as the currents $I_{B1}$ and $I_{B2}$ which flow through the elements $M_1$, $M_2$ of the circuit $G_2$ based on the current $I_B$ flowing through the feeder B. Also assuming that the current $I_{C2}$ flowing through the feeder $D_2$ electromagnetically induces currents $I'_{C21}$ and $I'_{C22}$ which flow respectively through the elements $M_1$, $M_2$ of the circuit $G_2$, the feeder $D_2$ is electromagnetically coupled with the elements $M_1$, $M_2$ of the circuit $G_2$ such that the currents $I'_{C21}$ and $I'_{C22}$ flow respectively in the same direction as and in the opposite direction to the currents $I_{B1}$ and $I_{B2}$ flowing through the elements $M_1$, $M_2$ respectively, of the circuit $G_2$.

With this circuit arrangement, the circuit Q in the logic circuit $G_1$ will function to have its zero and finite voltage states based on the combinations of the currents $I_B$, $I_{C1}$ and $I_{C2}$ in the same manner as that of the circuit arrangement shown in FIG. 8. In the circuit Q in the logic circuit $G_2$, the currents $I'_{C11}$ and $I'_{C12}$ and the currents $I'_{C21}$ and $I'_{C22}$ flow in the opposite direction with respect to the currents $I_{C11}$ and $I'_{C12}$ and the currents $I_{C21}$ and $I'_{C22}$ respectively. Therefore, the circuit $G_2$ will be in its finite voltage state only when the current $I_{C2}$ is at "0" and the currents $I_B$ and $I_{C1}$ are at "1". Since the circuits Q, Q of the logic circuits $G_1$, $G_2$ are connected in series in the common bias current feeder B, there is no possibility that the circuits $G_1$ and $G_2$ will be in the finite voltage state simultaneously. When either the circuit $G_1$ or $G_2$ is in the finite voltage state, the current $I_F$ flows in the output current line F branching from the circuit $G_1$.

Assuming that the currents $I_{C1}$ and $I_{C2}$ flowing respectively through the input current feeders $D_1$ and $D_2$ correspond to logic input signals X and Y, respectively, and the current $I_F$ flowing through the output feeder F corresponds to a logic output signal Z, the logic output signal Z is at "1" only when either the input signal X or Y is at "1", which is a function of an exclusive-OR logic circuit. Such an exclusive-OR logic function is thus available by a simple arrangement comprising four Josephson junctions, four inductance elements and one impedance element. Even if the input signals X and Y were relatively low in level, the exclusive-OR logic function can be accomplished at high speeds without requiring increased power consumption. Furthermore, the overall circuit structure is relatively small in size. Since only one asymmetrical quantum interferometric circuit at most will be in the finite voltage state, this logic circuit can produce an output voltage of the same level as that of an output from a logic circuit comprising a gate constituted by one asymmetrical quantum interferometric circuit, thereby ensuring good matching between the two logic circuits.

"Cryotron Exclusive OR Function" by B. S. Landman, IBM Technical Disclosure Bulletin, vol. 15, No. 5, October 1972 describes an exclusive-OR logic circuit having a fundamental gate comprised of Josephson junctions. However, because of employment of long Josephson junctions, the circuit of this reference requires increased power consumption and its operating speed is low.

Figures 12, 13:
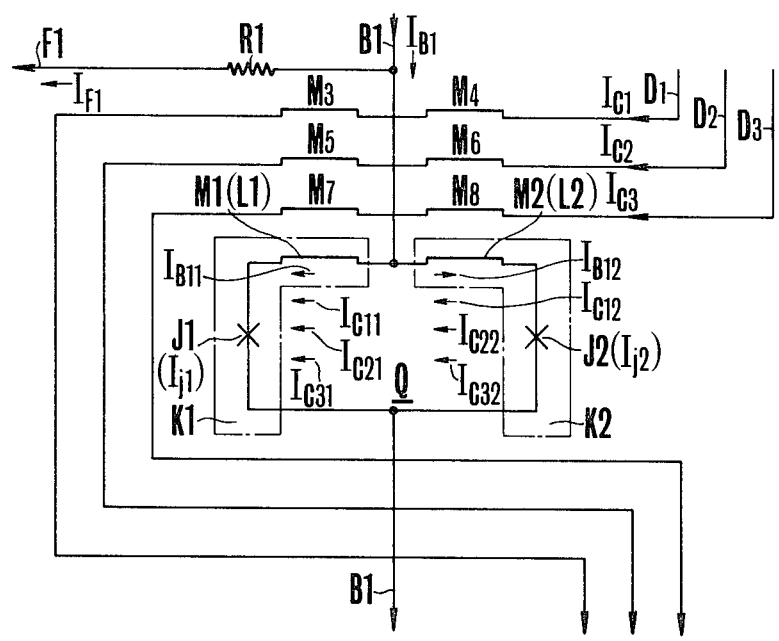
FIG. 12 is a majority logic circuit having the asymmetrical quantum interferometric circuit of the present invention.
FIG. 13 is a truth table for the circuit of FIG. 12.

A majority logic circuit shown in FIG. 12 employs an asymmetrical quantum interferometric circuit according to the present invention. Control currents $I_{C1}$, $I_{C2}$ and $I_{C3}$ flow respectively through feeders $D_1$, $D_2$ and $D_3$ in the same direction as the positive control current $I_C$ shown in FIG. 2. It is assumed that the current $I_B$ has a value of the point $P_1$ in FIG. 2 and the absolute values of the currents $I_{C1}$, $I_{C2}$ and $I_{C3}$ are each equal to the point $P_3$. It is also assumed that the currents $I_{B1}$, $I_{C1}$, $I_{C2}$ and $I_{C3}$ are so selected that the coordinate position of the currents $I_{B1}$, $I_{C1}$ is indicated by the point $P_5$ in FIG. 2 which is within the threshold curve A, the coordinate position of the current $I_{B1}$ and the sum of the currents $I_{C1}$, $I_{C2}$ is indicated by the point $P_6$, and the coordinate position of the current $I_{B1}$ and the sum of the currents $I_{C1}$, $I_{C2}$ and $I_{C3}$ is indicated by the point $P_7$, the points $P_6$, $P_7$ are then outside the curve A. Values of the currents $I_{B1}$, $I_{C1}$, $I_{C2}$ and $I_{C3}$ meeting such conditions are represented herein by binary "1". It is also assumed that when the current $I_{B1}$, $I_{C1}$ and $I_{C2}$ are all zero, their values are binary "0" and that the presence of current $I_{F1}$ branching from current $I_{B1}$ into the output line $F_1$ represents binary "1" and the absence thereof binary "0".

With the current $I_{B1}$ being at "1", the current $I_{F1}$ becomes "1" only when two or more of the currents $I_{C1}$, $I_{C2}$ and $I_{C3}$ are at "1" and the current $I_{F1}$ becomes "0" at other values of the currents $I_{C1}$, $I_{C2}$ and $I_{C3}$ as shown in truth table of FIG. 13.

In the foregoing description, the majority logic circuit (FIG. 12) and the exclusive-OR logic circuit (FIG. 10) have been exemplified as incorporating the asymmetrical quantum interferometric circuits according to the present invention. These logic circuits may advantageously be combined in construct adder circuits as will be described below.

Figure 14:
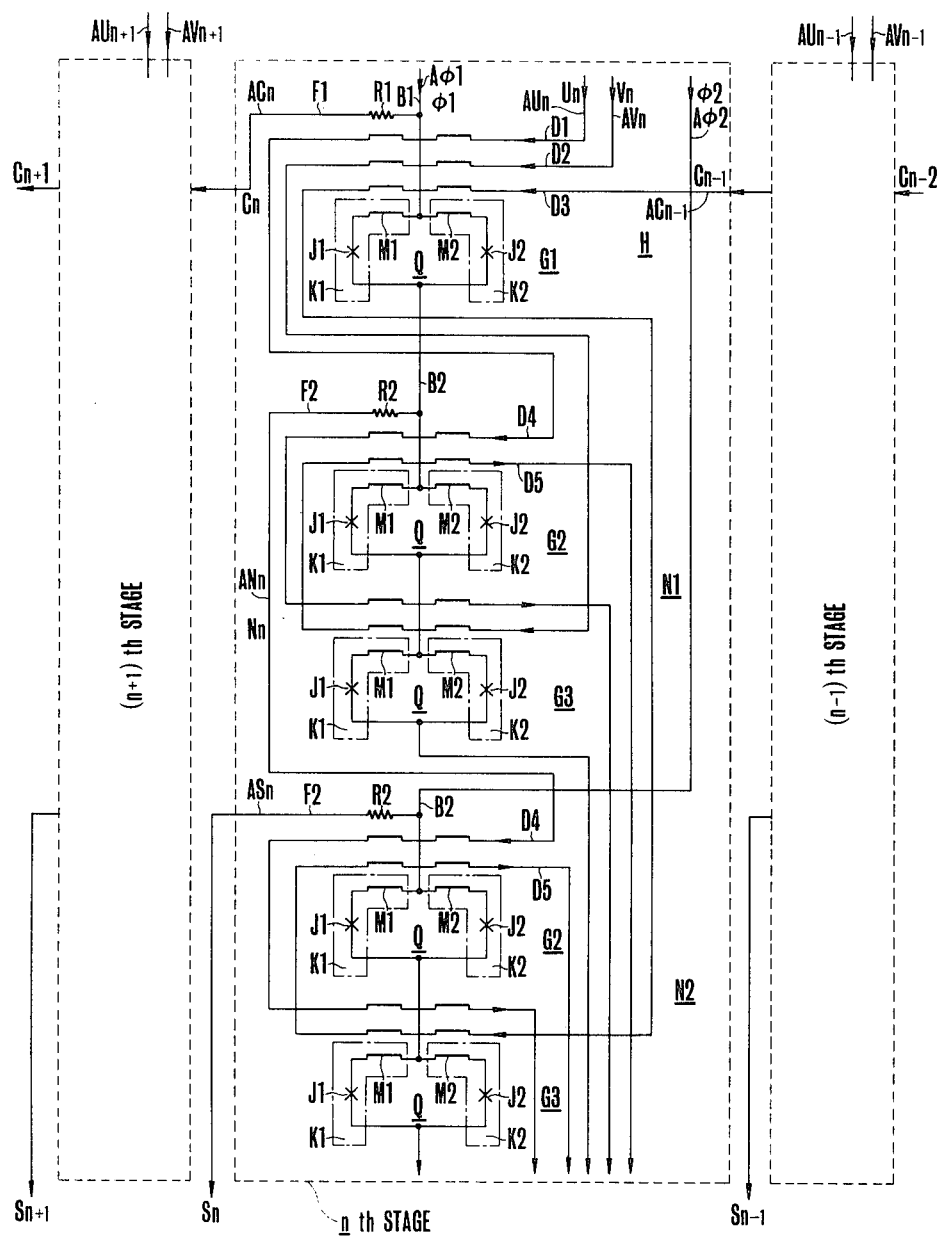
FIG. 14 is a circuit diagram of a binary full adder circuit having the asymmetrical quantum interferometric circuits of the present invention.

A binary full adder circuit of the present invention including an nth stage as shown in FIG. 14 utilizes a majority logic circuit H such as shown in FIG. 12 and two exclusive-OR logic circuits $N_1$ and $N_2$ each of which is the same as shown in FIG. 10. Equivalent (n−1)th and (n+1)th stages are connected in tandem with the nth stage for parallel full adder operation.

The majority logic circuit H has a bias current feeder $B_1$ connected in series with a bias current feeder $B_2$ of the exclusive-OR logic circuit $N_1$, constituting a bias current feeder $A\phi 1$. The bias current feeder $B_2$ of the exclusive-OR logic circuit $N_2$ is designated at $A\phi 2$. An input current feeder $D_1$ of the circuit H and an input current feeder $D_4$ of the circuit $N_1$ are connected in series with each other to serve as an input current feeder AUn. The circuit H also has an input current feeder $D_2$ connected in series with an input current feeder $D_5$ of the circuit $N_1$, the feeders $D_2$, $D_5$ constituting an input current feeder AVn. An input current feeder $AC_{n-1}$ is constituted by an input current feeder $D_3$ of the circuit H and an input current feeder $D_5$ of the circuit $N_2$, the feeders $D_3$, $D_5$ being connected in series with each other. The circuit $N_1$ has an output current feeder $F_2$ which is connected in series with an input current feeder $D_4$ of the circuit $N_2$, the feeders $F_2$, $D_4$ serving as an input and output current feeder ANn. The output current feeder $F_1$ of the circuit H serves as an output current feeder ACn, and the output current feeder $F_2$ of the circuit $N_2$ serves as an output current feeder ASn. The bias current feeders $A\phi 1$ and $A\phi 2$ are supplied respectively with timing signals $\phi 1$ and $\phi 2$. The input current feeders AUn and AVn are supplied respectively with logic input signals Un and Vn for the nth stage. The input current feeder $AC_{n-1}$ is supplied with a logic carry signal $C_{n-1}$ from the previous (n−1)th stage.

Figure 15:
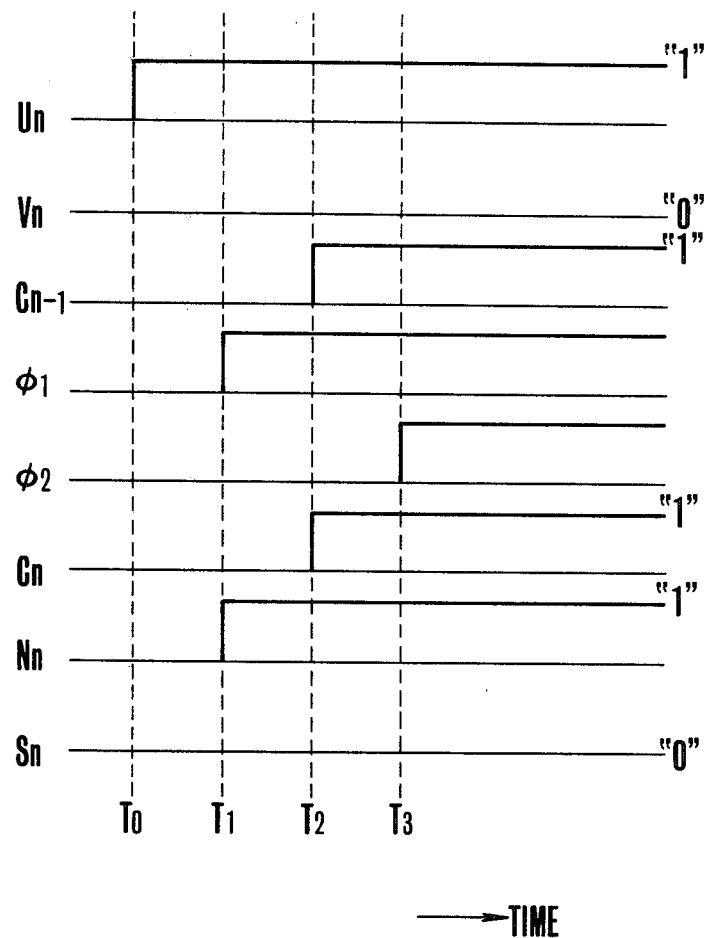
FIG. 15 is a timing chart illustrative of the operation of the circuit shown in FIG. 14.

The operation of the full adder circuit will be described with reference to FIG. 15 which is a timing chart showing relations between various input and clock signals, FIG. 15 being illustrative, by way of example, of the situation where the first input signal Un is at "1", the second input signal Vn is at "0", and the carry signal $C_{n-1}$ from the previous (n−1)th stage is at "1", all signals being added at the nth stage. Two signal inputs Ui, Vi to be added are applied to all stages at a time $T_o$. In FIG. 15, the signal Un at "1" and the signal Vn at "0" are applied as inputs to the nth stage. At a time $T_1$, the clock signal $\phi 1$ is applied as a bias to the circuits H and $N_1$ and the computation is effected. The circuit H produces an output of "0" as only its input Un is at "1", and the circuit $N_1$ produces an output $N_n$ of "1". Carry signals are progressively established from the lower stages. At a time $T_2$, the carry signal $C_{n-1}$ is applied from the (n−1)th stage, and 2-out-of-3 computation is effected in the circuit H, whereupon the carry signal Cn is established as being "1" at the nth stage in FIG. 15. After carry signals Ci have been established for all of the stages, the clock signal $\phi 2$ is applied to the circuit $N_2$ at a time $T_3$ for exclusive-ORing of the signals Nn and $C_{n-1}$. A summation signal Sn is determined as "0" at the nth stage in FIG. 15. Likewise, the summation signals Si are determined simultaneously for all of the stages, completing binary parallel full adder computation. With such an adder circuit arrangement, only three gates are necessary for the commutation at one stage. Accordingly, the number of gates is much smaller than with conventional adders, with the result that time delays at the gates are reduced and hence the operating time of the adder circuit is shortened.

Because of priority between the bias current and the control current during voltage switching of the symmetrical quantum interferometric circuit, it is necessary for the exclusive-OR circuit to be supplied with the bias signal after the two inputs have been established. However, there is no limitation imposed on the majority logic circuit as to the timings of input and bias signals except that all inputs are established when the gate is supplied with the bias signal. The circuit $N_1$ in the full adder circuit is therefore required to be supplied with the clock signal after the signals Un, Vn have been established. However, the clock signal may be applied to the circuit H either before or after the signals Un, Vn and $C_{n-1}$ are established. While in FIG. 14 the clock signal $\phi 1$ is supplied in synchronism through series-connected lines to the circuits H and $N_1$, such an arrangement is not a requirement for the operation of the full adder circuit according to the present invention. The full adder circuit may be actuated by suppling the clock $\phi 1$ as a bias signal to the circuit H, by suppling the clock $\phi 2$ as a bias signal to the circuit $N_1$ after establishment of the signals Un, Vn, and by supplying an additional clock $\phi 3$ (not shown) to the circuit $N_2$ after establishment of the signals Nn, $C_{n-1}$.

As described above with reference to FIG. 14, the first input feeder of the circuit H is connected in series with the first input feeder of the circuit $N_1$, and the second input feeder of the circuit H is connected in series with the second input feeder of the circuit $N_1$. Such a wiring arrangement is not a requirement, however, as long as the inputs Un, Vn and the carry signal $C_{n-1}$ are applied to the circuit H, the signals Un, Vn to the circuit $N_1$, and the output Nn from the circuit $N_1$ and the carry signal $C_{n-1}$ to the circuit $N_2$. For example, the signal Un may be input in parallel to the first input feeder of the circuit H and to the first input feeder of the circuit $N_1$.

Although in the illustrated embodiment the signal Un at "1", the signal Vn at "0" and the signal $C_{n-1}$ at "1" are utilized to explain the operation of the full adder circuit shown in FIG. 14, other combinations of values for these signals may be used as is apparent to those versed in the art. FIG. 16 shows a truth table for the input signals Un, Vn and input carry signal $C_{n-1}$ and resulting values for the output carry signal Cn and output signal Sn.

The binary adder circuit shown in FIG. 14 has the function of a binary full adder circuit, and comprises one majority logic circuit including two Josephson junctions and two inductance elements, two exclusive-OR logic circuits including four Josephson junctions and four inductance elements, and three resistors. The adder circuit is thus simple in structure, small in size, requires reduced power consumption, and accomplishes the function of a binary full adder circuit at high speeds even if the input signals Un, Vn and input carry signal $C_{n-1}$ were of a relatively low level.

Figure 17:
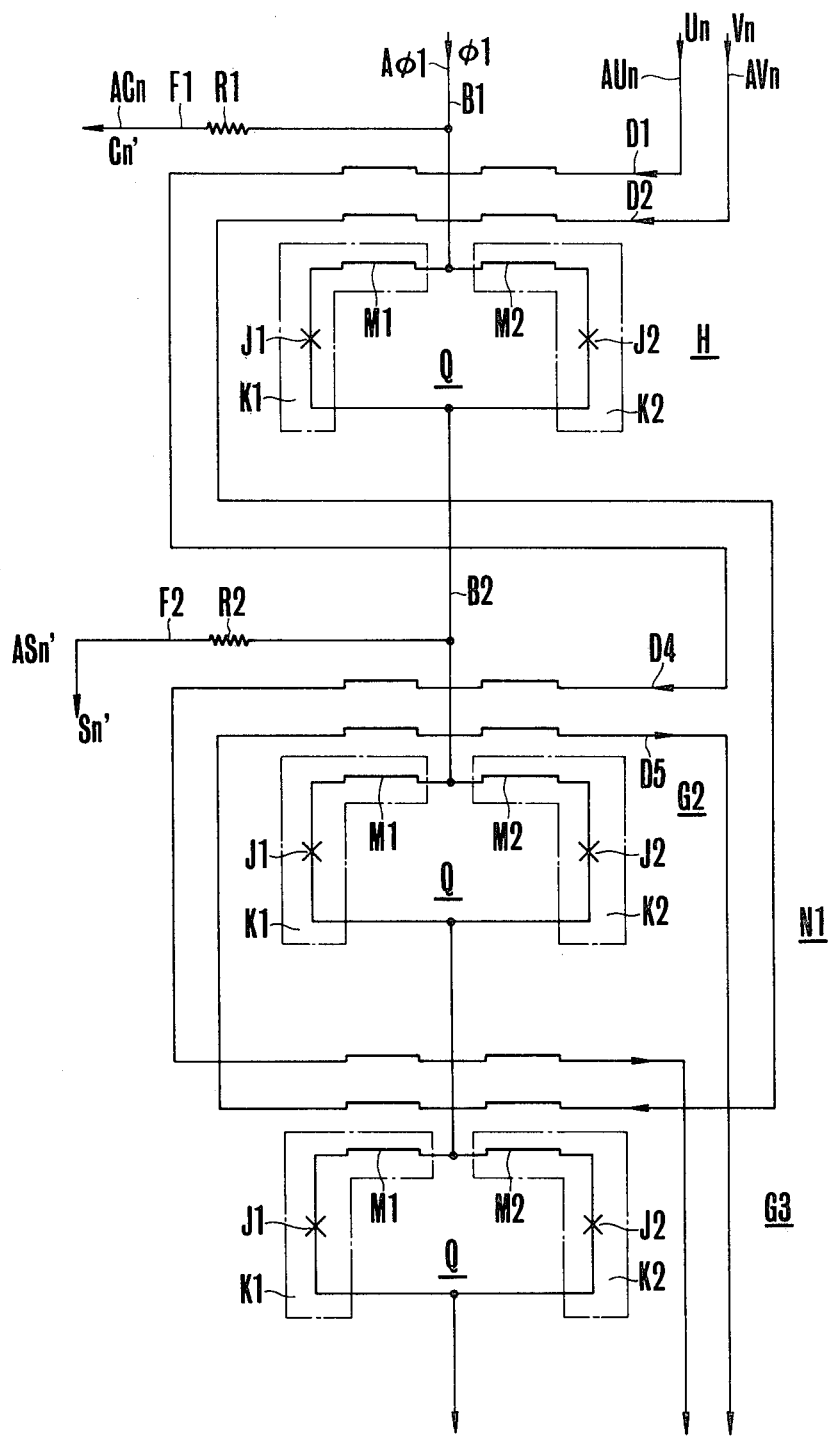
FIG. 17 is a circuit diagram of a binary half adder circuit having the asymmetrical quantum interferometric circuits according to the present invention.

FIG. 17 shows a binary half adder circuit which is different in structure from the circuit of FIG. 14 in that the input current feeder $D_3$ of the majority logic circuit H and hence the input feeder $AC_{n-1}$ are removed, and the input and output current feeder ANn is replaced by an output current feeder ASn'. FIG. 18 illustrates a truth table for the input signals Un, Vn and resulting values for an output carry signal Cn' and an output signal Sn' that appear on output current feeders ACn, ASn'. The binary half adder circuit of FIG. 17 has advantages similar to those accruing from the binary full adder circuit shown in FIG. 14.

Although certain preferred embodiments have been shown and described in detail, it should be understood that many changes and modifications may be made therein without departing from the scope of the appended claims.

What is claimed is:

1. A logic circuit having at least one asymmetrical quantum interferometric circuit, wherein the logic output states correspond to the voltage states of the asymmetrical quantum interferometric circuit, said asymmetrical quantum interferometric circuit comprising: a parallel circuit including a first Josephson junction having a threshold current $I_{j1}$, and a first inductance element having an inductance $L_1$ and connected in series with said first Josephson junction, a second Josephson junction having a threshold current $I_{j2}$, and a second inductance element having an inductance $L_2$ and connected in series with said second Josephson junction, said series-connected first Josephson junction and first inductance element being connected in parallel with said series-connected second Josephson junction and second inductance element to form a parallel circuit; a bias feeder connected to said parallel circuit for supplying a bias current to said parallel circuit; a control current feeder having series-connected inductance elements electromagnetically coupled respectively with said first and second inductance elements for supplying a control current to same; and an output feeder operatively connected to said bias current feeder and said parallel circuit, the arrangement being such that the following relations are satisfied: $I_{j2}/I_{j1} = L_1/L_2 = a$, and $L_1 I_{j1} = L_2 I_{j2} < \Phi_o$ where a is a real number greater than 1, and $\Phi_o$ is a flux quantum unit equal to $2 \times 10^{-15}$ Wb.

2. A logic circuit according to claim 1, wherein said real number a ranges from 1 to 20.

3. A logic circuit according to claim 1, wherein said real number a ranges from 1 to 10.

4. An exclusive-OR logic circuit comprising: a pair of first and second series-connected asymmetrical quantum interferometric circuits each including a first circuit having a first Josephson junction with a threshold current $I_{j1}$ and a first inductance element with an inductance $L_1$ connected in series with said first Josephson junction, and a second circuit having a second Josephson junction with a threshold current $I_{j2}$ different from said threshold current $I_{j1}$ and a second inductance element with an inductance $L_2$ connected in series with said second Josephson junction, said first and second circuits being connected in parallel with each other, the arrangement being such that the following relations are satisfied: $I_{j2}/I_{j1} = L_1/L_2 = a$, and $L_1 I_{j1} = L_2 I_{j2} < \Phi_o$ where a is a real number greater than 1, and $\Phi_o$ is a flux quantum unit equal to $2 \times 10^{-15}$ Wb; a bias current feeder connected to said first and second series-connected asymmetrical quantum interferometric circuits; a first input current feeder electromagnetically coupled with said first and second inductance elements of each of said first and second asymmetrical quantum interferometric circuits such that a current flowing through said first input current feeder electromagnetically induces curents to flow through said first and second inductance elements, respectively, of said first asymmetrical quantum inteferometric circuit in the same direction as and in the opposite direction to currents flowing through said first and second inductance elements of said first asymmetrical quantum interferometric circuit based on a bias current flowing through said bias current feeder and such that a current flowing through said first input current feeder electromagnetically induces currents to flow through said first and second inductance elements, respectively, of said second asymmetrical quantum interferometric circuit in the opposite direction to and in the same direction as currents flowing through said first and second inductance elements of said second asymmetrical quantum interferometric circuit based on the bias current flowing through said bias current feeder; a second input current feeder electromagnetically coupled with said first and second inductance elements of each of said first and second asymmetrical quantum interferometric circuits such that a current flowing through said second input current feeder electromagnetically induces currents to flow through said first and second inductance elements, respectively, of said first asymmetrical quantum interferometric circuit in the opposite direction to and in the same direction as currents flowing through said first and second inductance elements of said first asymmetrical quantum interferometric circuit based on the bias current flowing through said bias current feeder and such that a current flowing through said second input current feeder electromagnetically induces currents to flow through said first and second inductance elements, respectively, of said second asymmetrical quantum interferometric circuit in the same direction as and in the opposite direction to currents flowing through said first and second inductance elements of said second asymmetrical quantum interferometric circuit based on the bias current flowing through said bias current feeder; and an output current feeder connected to one terminal of said series-connected first and second asymmetrical quantum interferometric circuits.

5. A binary adder logic circuit comprising: a majority logic circuit including a first asymmetrical quantum interferometric circuit comprising a first circuit having a first Josephson junction with a threshold current $I_{j1}$ and a first inductance element with an inductance $L_1$ connected in series with said first Josephson junction, and a second circuit having a second Josephson junction with a threshold current $I_{j2}$ different from said threshold current $I_{j1}$ and a second inductance element with an inductance $L_2$ connected in series with said second Josephson junction, said first and second circuits being connected in parallel with each other, the arrangement being such that the following relations are satisfied: $I_{j2}/I_{j1} = L_1/L_2 = a$, and $L_1 I_{j1} = L_2 I_{j2} < \Phi_o$ where a is a real number greater than 1, and $\Phi_o$ is a flux quantum unit equal to $2 \times 10^{-15}$ Wb; a first bias current feeder connected to said first asymmetrical quantum interferometric circuit; first, second and third input current feeders electromagnetically coupled with said first and second inductance elements of said first asymmetrical quantum interferometric circuit such that currents flowing respectively through said first, second and third input current feeders electromagnetically induce currents to flow through said first and second inductance elements, respectively, of said first asymmetrical quantum interferometric circuit in the same direction as and in the opposite direction to currents flowing through said first and second inductance elements of said first asymmetrical quantum interferometric circuit based on a bias current flowing through said first bias current feeder; a first output current feeder connected to one terminal of said first asymmetrical quantum interferometric circuit; first and second exclusive-OR logic circuits each including series-connected second and third asymmetrical quantum inteferometric circuits each comprising a third circuit having a third Josephson junction with a threshold current $I_{j3}$ and a third inductance element with an inductance $L_3$ connected in series with said third Josephson junction, and a fourth circuit having a fourth Josephson junction with a threshold current $I_{j4}$ different from said threshold current $I_{j3}$ and a fourth inductance element with an inductance $L_4$ connected in series with said fourth Josephson junction, said third and fourth circuits being connected in parallel with each other, the arrangement being such that the following relations are satisfied: $I_{j4}/I_{j3}=L_3/L_4=a$, and $L_3 I_{j3}=L_4 I_{j4}<\Phi_o$ where a is a real number greater than 1, and $\Phi_o$ is a flux quantum unit equal to $2\times 10^{-15}$ Wb; a second bias current feeder connected to said series-connected second and third asymmetrical quantum interferometric circuits; a fourth input current feeder electromagnetically coupled with said third and fourth inductance elements of each of said second and third asymmetrical quantum interferometric circuits such that a current flowing through said fourth input current feeder induces currents to flow through said third and fourth inductance elements, respectively, of said second asymmetrical quantum interferometric circuit in the same direction as and in the opposite direction to currents flowing through said third and fourth inductance elements of said second asymmetrical quantum interferometric circuit based on a bias current flowing through said second bias current feeder, and such that a current flowing through said fourth input current feeder induces currents to flow through said third and fourth inductance elements, respectively, of said third asymmetrical quantum inteferometric circuit in the opposite direction to and in the same direction as currents flowing through said third and fourth inductance elements of said third asymmetrical quantum interferometric circuit based on the bias current flowing through said second bias current feeder; a fifth input current feeder electromagnetically coupled with said third and fourth inductance elements of each of said second and third asymmeterical quantum interferometric circuits such that a current flowing through said fifth input current feeder induces currents to flow through said third and fourth inductance elements, respectively, of said second asymmetrical quantum interferometric circuit in the opposite direction to and in the same direction as currents flowing through said third and fourth inductance elements of said second asymmetrical quantum interferometric circuit based on the bias current flowing through said second bias current feeder and such that a current flowing through said fifth input current feeder induces currents to flow through said third and fourth inductance elements, respectively, of said third asymmetrical quantum interferometric circuit in the same direction as and in the opposite direction to currents flowing through said third and fourth inductance elements of said third asymmetrical quantum interferometric circuit based on the bias current flowing through said second bias current feeder; and a second output current feeder connected to one terminal of said series-connected second and third asymmetrical quantum interferometric circuits; said first input current feeder of said majority logic circuit and said fourth input current feeder of said first exclusive-OR logic circuit being supplied with a first input logic signal, said second input current feeder of said majority logic circuit and said fifth input current feeder of said first exclusive-OR logic circuit being supplied with a second input logic signal, said third input current feeder of said majority logic circuit and said fifth input current feeder of said second exclusive-OR logic circuit being supplied with an input carry logic signal, said first output current feeder of said majority logic circuit producing an output carry logic signal in response to the supply of an output logic signal on the second output current feeder of said first exclusive-OR logic circuit to said fourth input current feeder of said second exclusive-OR logic circuit, thereby causing said second output current feeder of said second exclusive-OR logic circuit to produce a full adder output logic signal.

6. A binary adder logic circuit comprising: a majority logic circuit including a first asymmetrical quantum interferometric circuit comprising a first circuit having a first Josephson junction with a threshold current $I_{j1}$ and a first inductance element with an inductance $L_1$ connected in series with said first Josephson junction, and a second circuit having a second Josephson junction with a threshold current $I_{j2}$ different from said threshold current $I_{j1}$ and a second inductance element with an inductance $L_2$ connected in series with said second Josephson junction, said first and second circuits being connected in parallel with each other, the arrangement being such that the following relations are satisfied: $I_{j2}/I_{j1}=L_1/L_2=a$, and $L_1 I_{j1}=L_2 I_{j2}<\Phi_o$ where a is a real number greater than 1, and $\Phi_o$ is a flux quantum unit equal to $2\times 10^{-15}$ Wb; a first bias current feeder connected to said first asymmetrical quantum interferometric circuit; first and second input current feeders electromagnetically coupled with said first and second inductance elements of said first asymmetrical quantum interferometric circuit such that currents flowing through said first and second input current feeders induce currents to flow through said first and second inductance elements of said first asymmetrical quantum interferometric circuit in the same direction as and in the opposite direction to currents flowing through said first and second inductance elements, respectively, based on a bias current flowing through said first bias current feeder; a first output current feeder connected to one terminal of said first asymmetrical quantum interferometric circuit; an exclusive-OR logic circuit including series-connected second and third asymmetrical quantum circuits each comprising a third circuit having a third Josephson junction with a threshold current $I_{j3}$ and a third inductance element with an inductance $L_3$ connected in series with said third Josephson junction, and a fourth circuit having a fourth Josephson junction with a threshold current $I_{j4}$ different from said threshold current $I_{j3}$ and a fourth inductance element with an inductance $L_4$ connected in series with said fourth Josephson junction, said third and fourth circuits being connected in parallel with each other, the arrangement being such that the following relations are satisfied: $I_{j4}/I_{j3}=L_3/L_4=a$, and $L_3 I_{j3}=L_4 I_{j4}<\Phi_o$ where a is a real number greater than 1, and $\Phi_o$ is a flux quantum unit equal to $2\times 10^{-15}$ Wb; a second bias current feeder connected to said series-connected second and third asymmetrical quantum interferometric circuits; a fourth input current feeder electromagnetically coupled with said third and fourth inductance elements of each of said second and third asymmetrical quantum interferometric circuits such that a current flowing through said fourth input current feeder induces currents to flow through said third and fourth inductance elements, respectively, of said second asymmetrical quantum interferometric circuit in the same direction as and in the opposite direction to currents flowing through said third and fourth inductance elements of said second asymmetrical quantum interferometric circuit based on a bias current flowing through said second bias current feeder, and such that a current flowing through said fourth input current feeder induces currents to flow through said third and fourth inductance elements, respectively, of said third asymmetrical quantum interferometric circuit in the opposite direction to and in the same direction as currents flowing through said third and fourth inductance elements of said third asymmetrical quantum interferometric circuit based on the bias current flowing through said second bias current feeder; a fifth input current feeder electromagnetically coupled with said third and fourth inductance elements of each of said second and third asymmetrical quantum interferometric circuits such that a current flowing through said fifth current feeder induces currents to flow through said third and fourth inductance elements, respectively, of said second asymmetrical quantum interferometric circuit in the opposite direction to and in the same direction as currents flowing through said third and fourth inductance elements of said second asymmetrical quantum interferometric circuit based on the bias current flowing through said second bias current feeder and such that a current flowing through said fifth input current feeder induces currents to flow through said third and fourth inductance elements, respectively, of said third asymmetrical quantum interferometric circuit in the same direction as and in the opposite direction to currents flowing through said third and fourth inductance elements of said third asymmetrical quantum interferometric circuit based on the bias current flowing through said second bias current feeder; and a second output current feeder connected to one terminal of said series-connected second and third asymmetrical quantum interferometric circuits; said first output current feeder of said majority logic circuit producing an output carry logic signal in response to the supply of a first input logic signal to said first input current feeder of said majority logic circuit and said fourth input current feeder of said exclusive-OR logic circuit and the supply of a second input logic signal to said second input current feeder of said majority logic circuit and said fifth input current feeder of said exclusive-OR logic circuit, thereby causing said second output current feeder of said exclusive-OR logic circuit to produce a half adder output logic signal.

* * * * *